US012607330B2

(12) United States Patent
Funakoshi et al.

(10) Patent No.: US 12,607,330 B2
(45) Date of Patent: Apr. 21, 2026

(54) OPTICAL HEATING APPARATUS

(71) Applicant: Ushio Denki Kabushiki Kaisha, Tokyo (JP)

(72) Inventors: Mitsuo Funakoshi, Tokyo (JP); Takahiro Inoue, Tokyo (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 18/811,207

(22) Filed: Aug. 21, 2024

(65) Prior Publication Data

US 2025/0075889 A1     Mar. 6, 2025

(30) Foreign Application Priority Data

Sep. 5, 2023     (JP) ................................. 2023-143728

(51) Int. Cl.
| | |
|---|---|
| *F21V 19/00* | (2006.01) |
| *F21V 29/503* | (2015.01) |
| *F21V 29/70* | (2015.01) |
| *H05B 3/00* | (2006.01) |
| *H10P 72/00* | (2026.01) |

(52) U.S. Cl.
CPC ........ *F21V 19/0055* (2013.01); *F21V 29/503* (2015.01); *F21V 29/70* (2015.01); *H05B 3/0047* (2013.01); *H10P 72/0436* (2026.01)

(58) Field of Classification Search
CPC .... F21V 19/0055; F21V 29/503; F21V 29/70; F21V 2105/10; F21V 2113/00; F21V 17/12; F21Y 2105/10; F21Y 211/00; F21Y 2115/10; F21Y 2105/18; H01L 21/67115;
(Continued)

(56) References Cited

U.S. PATENT DOCUMENTS

| | | | |
|---|---|---|---|
| 2010/0061092 A1* | 3/2010 | Yang ....................... | F21V 29/75 362/234 |
| 2010/0118496 A1* | 5/2010 | Lo ........................... | F21V 29/74 361/710 |

(Continued)

FOREIGN PATENT DOCUMENTS

| | | | | |
|---|---|---|---|---|
| CN | 201298538 Y | * | 8/2009 | ........ H01L 21/67115 |
| EP | 2322853 A2 | * | 5/2011 | ............... F21K 9/00 |

(Continued)

*Primary Examiner* — Erin Kryukova
(74) *Attorney, Agent, or Firm* — Studebaker Brackett PLLC

(57)     ABSTRACT

Provided is a light source unit in which mounted light-emitting elements are cooled more homogeneously. The light source unit includes: a substrate having a first main surface on which a plurality of light-emitting diodes (LEDs) are mounted; a first through hole that communicates between the first main surface and a second main surface on a side opposite to the first main surface, the first through hole having a center located within a predetermined range from the center of gravity of the first main surface when viewed in a direction orthogonal to the first main surface of the substrate; a heatsink provided on the side of the second main surface of the substrate; and a first fixing screw that is inserted through the first through hole of the substrate and screwed into a screw hole, provided corresponding to the first through hole, to fix the substrate and the heatsink.

2 Claims, 9 Drawing Sheets

(58) Field of Classification Search
CPC ............ H01L 21/67114; H03B 3/0047; H05B
3/0047; H10P 72/0436
See application file for complete search history.

(56) References Cited

U.S. PATENT DOCUMENTS

| | | | | |
|---|---|---|---|---|
| 2013/0009546 A1* | 1/2013 | Hollander | ............... | H05B 45/00 |
| | | | | 315/192 |
| 2015/0260390 A1* | 9/2015 | Bretschneider | ..... | F21V 19/0055 |
| | | | | 362/373 |
| 2016/0379853 A1* | 12/2016 | Schaller | ............ | H01L 21/67115 |
| | | | | 361/234 |
| 2019/0318946 A1* | 10/2019 | Kim | .................. | H01L 21/67115 |
| 2020/0227284 A1* | 7/2020 | Mui | .................. | H01L 21/67115 |
| 2023/0232501 A1* | 7/2023 | Gouda | ................ | H05B 3/0047 |
| | | | | 392/411 |

FOREIGN PATENT DOCUMENTS

| | | | | | | |
|---|---|---|---|---|---|---|
| JP | 2010-153734 | A | | 7/2010 | | |
| JP | 2023105769 | A | * | 7/2023 | ......... | G01R 31/2831 |
| KR | 20160144765 | A | * | 12/2016 | | |
| KR | 20220088551 | A | * | 6/2022 | ........ | H01L 21/67115 |
| KR | 102483766 | B1 | * | 1/2023 | | |

* cited by examiner

OPTICAL HEATING APPARATUS

CROSS-REFERENCE TO RELATED APPLICATION

The present invention claims the benefit of priority to Japanese Patent Application No. 2023-143728 filed on Sep. 5, 2023 with the Japanese Patent Office, the entire contents of which are incorporated herein by reference in its entirety.

BACKGROUND OF THE INVENTION

Field of the Invention

The present invention relates to a light source unit.

Description of the Related Art

In a semiconductor manufacturing process, various types of thermal treatment, such as film forming treatment, oxidation diffusion treatment, reforming treatment, and annealing treatment, are performed on an object to be processed, such as a semiconductor wafer. Light is often used when these types of thermal treatment are performed. Heating the object to be processed using the light in this manner is referred to as "optical heating". The light used for heating is referred to as "heating light".

As an apparatus for performing heating treatment on a semiconductor wafer using optical heating, a heating apparatus in which light-emitting diodes (LEDs), each being a type of light-emitting elements, are mounted on a substrate at a high density is known. Here, it is known that the luminous efficiency of the light-emitting element, such as an LED or a laser diode (LD), decreases when the temperature of the element itself increases. Thus, for example, a heating apparatus including a heatsink on the side opposite to the mounting surface of a substrate has been proposed to cool an LED mounted as a light-emitting element, as described in Patent Document 1 below.

PRIOR ART DOCUMENT

Patent Document

Patent Document 1: JP-A-2010-153734

SUMMARY OF THE INVENTION

Here, the present inventors have checked the temperature distribution of the substrate on which the light-emitting elements are mounted during heating treatment to cool the light-emitting elements more efficiently and homogeneously, and have noticed that, in many cases, there is a bias in the temperature distribution of the substrate.

In view of the above problem, an object of the present invention is to provide a light source unit in which mounted light-emitting elements are cooled more homogeneously.

A light source unit according to the present invention includes:

a substrate having a first main surface on which a plurality of light-emitting diodes (LEDs) are mounted;

a first through hole that communicates between the first main surface and a second main surface of the substrate, the second main surface being on a side opposite to the first main surface, the first through hole having a center located within a predetermined range from a center of gravity of the first main surface when viewed in a direction orthogonal to the first main surface of the substrate;

a heatsink provided on a side of the second main surface of the substrate; and a first fixing screw that is inserted through the first through hole of the substrate and screwed into a screw hole, provided corresponding to the first through hole, to fix the substrate and the heatsink.

In the present specification, the "center of gravity" is used with the intent to refer to a point corresponding to a geometric center on a predetermined surface. Furthermore, in the present specification, "within a predetermined range from the center of gravity" refers to an area where the distance from the center of gravity is within 20% of the maximum diagonal distance of the first main surface.

The present inventors have intensively studied the cause of the non-homogeneous temperature distribution of the substrate during heating treatment and have found that the temperature near the center of gravity (central portion) of the substrate, on which the light-emitting elements are mounted, is higher than the temperature assumed at the time of design.

In a conventional light source unit, light-emitting elements are arranged at a high density on the central portion side of the first main surface of a substrate, and a through hole for inserting a fixing screw is formed near the outer edge of the substrate.

Here, on the first main surface side where the light-emitting elements are mounted, the temperature becomes high during light emission, and thermal expansion occurs. Conversely, on the second main surface side where a heat conductive member and a heatsink are connected, the temperature becomes relatively low, and thermal expansion does not occur as much as on the first main surface. Thus, as described above, the vicinity of the center of gravity (central portion) of the substrate has been deformed away from the heatsink.

Then, when the deformation as described above occurs in the substrate in which only the outer edge is fixed with the fixing screw, contact between the substrate and the heatsink or between the substrate and the heat conductive member cannot be maintained near the center of gravity (central portion) of the second main surface, and heat dissipation is not performed sufficiently.

Therefore, with the above configuration, the light source unit can maintain contact between the vicinity of the center of gravity (central portion) of the second main surface of the substrate and the heatsink or the heat conductive member even when the substrate is deformed.

The light source unit may further include:

a second through hole that communicates between the first main surface and the second main surface of the substrate and is formed at a position where a separation distance from the first through hole is 55% or less of the maximum diagonal distance of the first main surface of the substrate when viewed in the direction orthogonal to the first main surface; and a second fixing screw that is inserted through the second through hole of the substrate and screwed into a screw hole, provided corresponding to the second through hole, to fix the substrate and the heatsink.

In the present specification, the separation distance between the first through hole and the second through hole is intended to be the separation distance between the centers of the respective through holes when viewed in a direction orthogonal to the first main surface of the substrate.

The light source unit with the above configuration can more reliably maintain contact between the substrate and the heatsink or the heat conductive member at a plurality of points.

According to the present invention, a light source unit in which mounted light-emitting elements are cooled more homogeneously is realized.

DETAILED DESCRIPTION OF THE PREFERRED EMBODIMENTS

A light source unit of the present invention is hereinafter described with reference to the drawings. Note that all the following drawings are schematically illustrated, and the numbers of components on the drawings do not necessarily coincide with the actual numbers of components.

Figure 1:
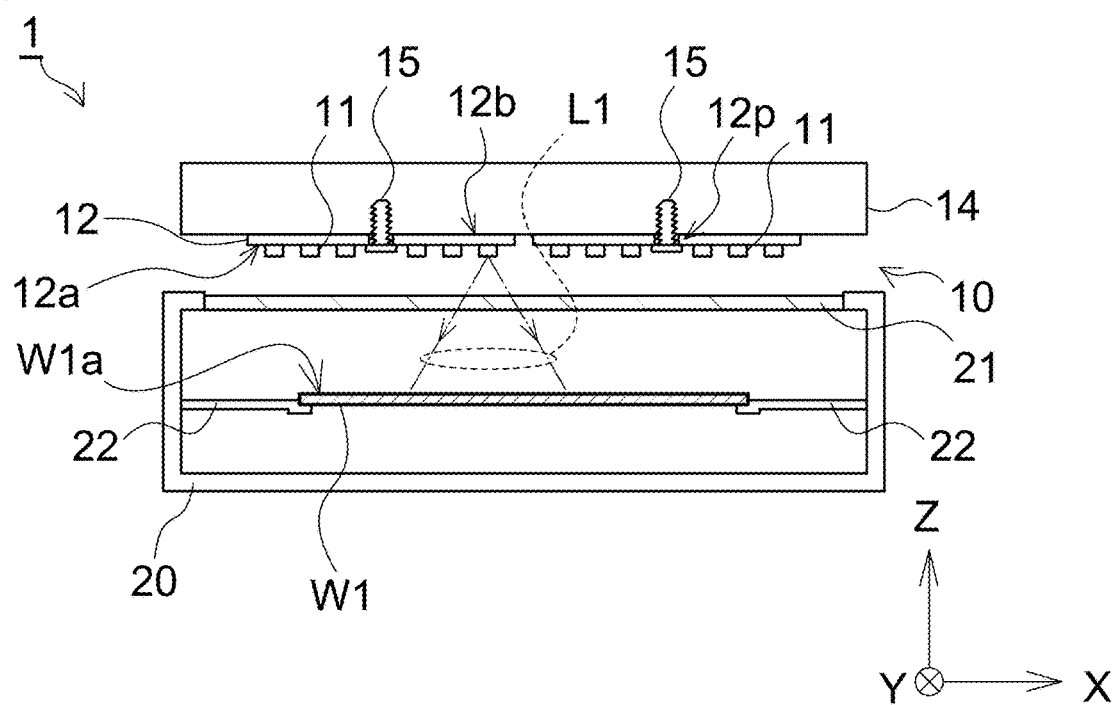
FIG. 1 is a cross-sectional view schematically illustrating a configuration of one embodiment of an optical heating apparatus.
Figure 2A:
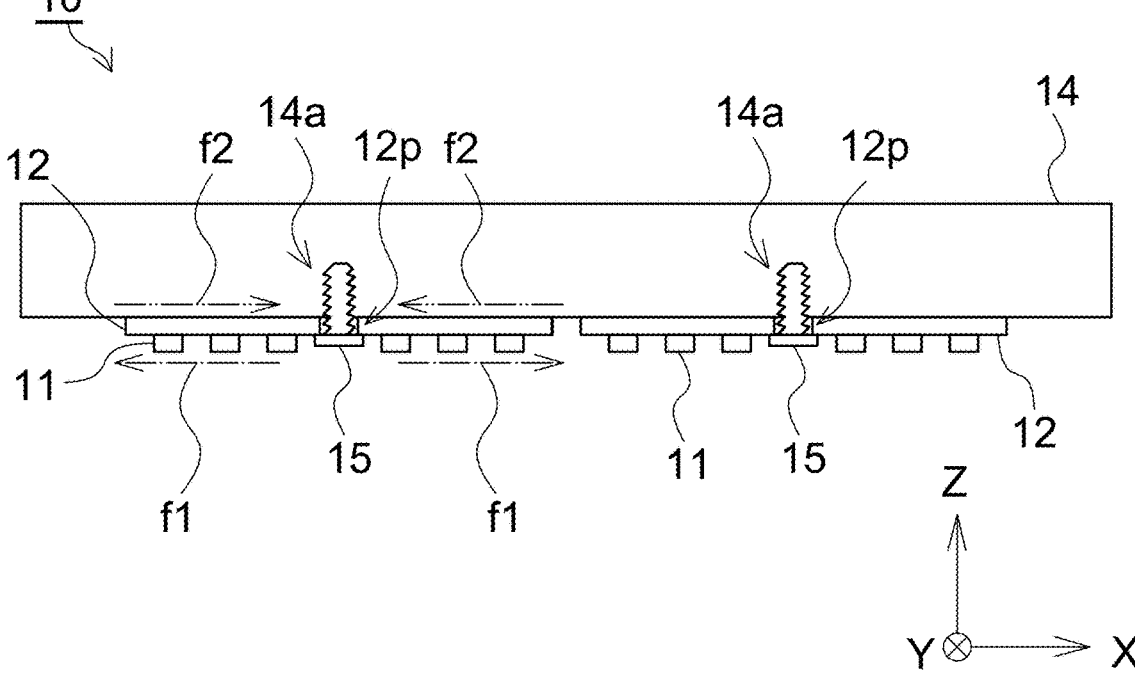
FIG. 2A is a cross-sectional view of a light source unit in FIG. 1 when viewed in the Y direction.
Figure 2B:
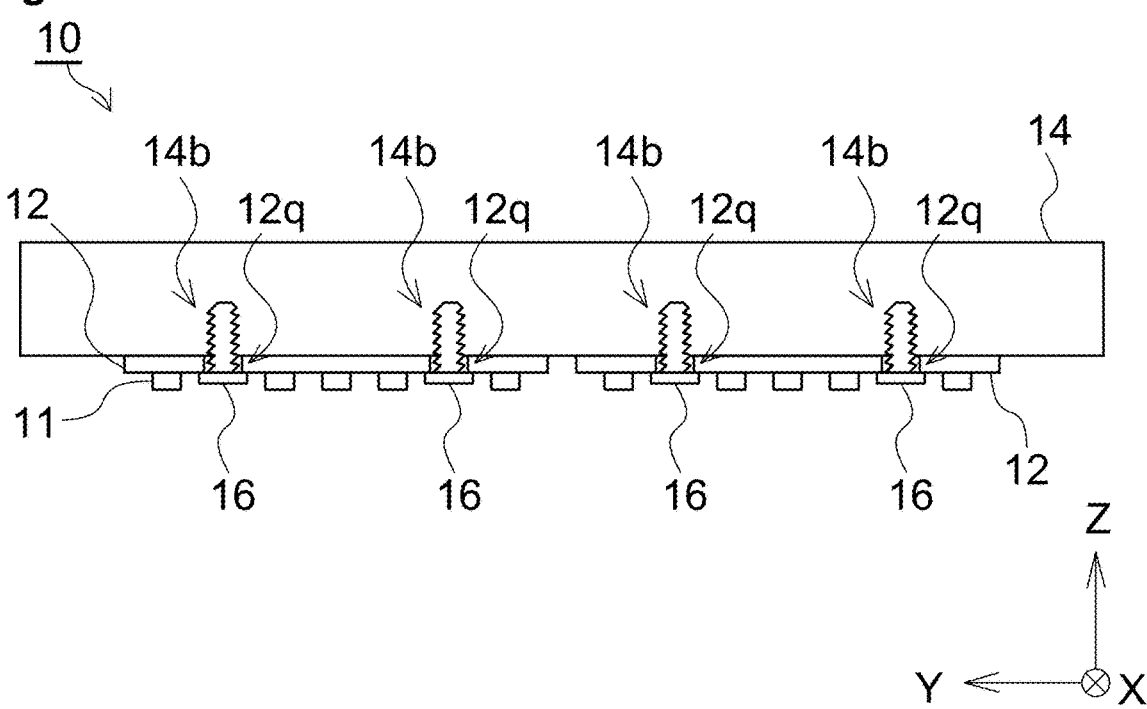
FIG. 2B is a cross-sectional view of the light source unit in FIG. 1 when viewed in the X direction.
Figure 3:
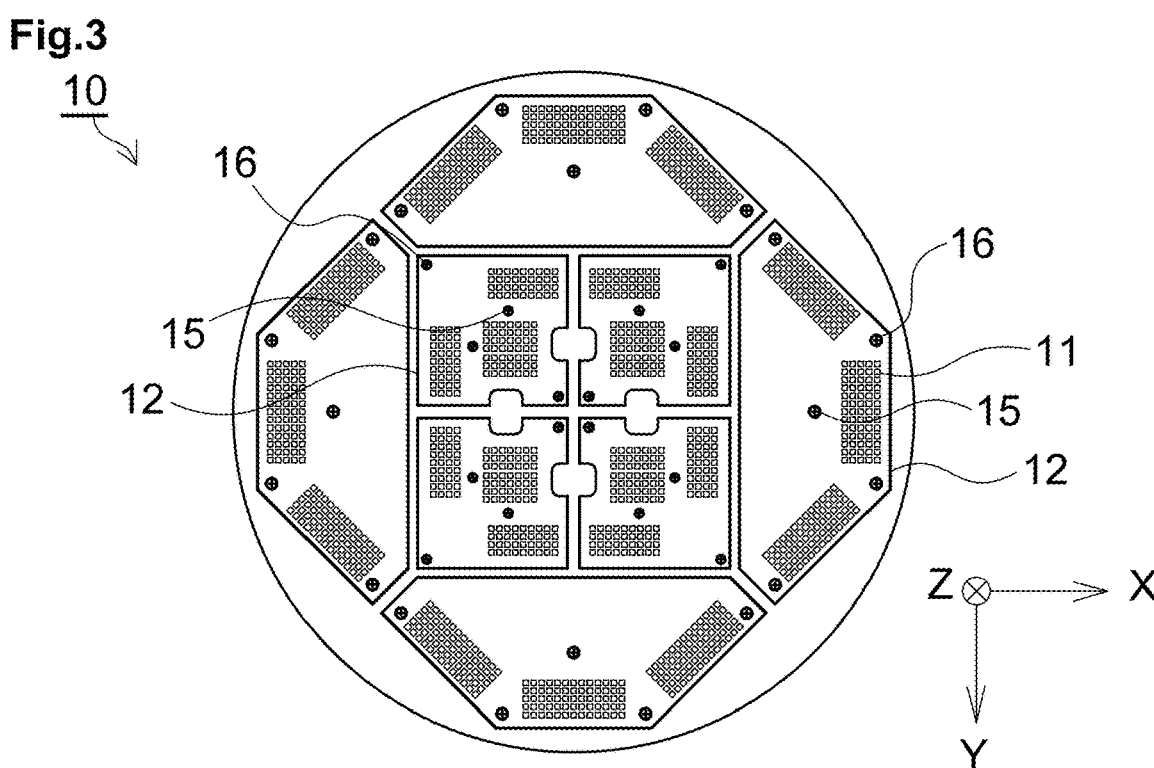
FIG. 3 is a schematic view of the light source unit when viewed from the −Z side.

FIG. 1 is a cross-sectional view schematically illustrating a configuration of one embodiment of an optical heating apparatus 1. FIG. 2A is a view of a light source unit 10 in FIG. 1 when viewed in a Y direction. FIG. 2B is a cross-sectional view of the light source unit 10 in FIG. 1 when viewed in an X direction. FIG. 3 is a schematic view of the light source unit 10 when viewed from the −Z side.

As illustrated in FIG. 1, the optical heating apparatus 1 includes the light source unit 10 and a chamber 20 in which a substrate to be treated W1 is accommodated. Note that the substrate to be treated W1 is assumed to be a semiconductor wafer, a display panel, a glass substrate, or the like. In addition, the semiconductor wafer is not particularly limited to a silicon (Si) substrate, and a silicon carbide (SiC) substrate or the like is also assumed.

In the following description, as illustrated in FIG. 1, a direction in which the light source unit 10 and the chamber 20 face each other is defined as a Z direction, and a plane orthogonal to the Z direction, that is, a plane parallel to a first main surface 12a of a substrate 12, is defined as an XY plane. In the present embodiment, there is no need to distinguish between the X and Y directions, which are mutually orthogonal and form the XY plane. However, in FIGS. 1 to 2B, the direction in which the first fixing screws 15 are arranged will be described as the X direction, and the direction in which the second fixing screws 16 are arranged will be described as the Y direction. In FIGS. 3 to 16, the direction is not specified by the fixing screws (15 and 16), but any directions orthogonal to each other on a plane orthogonal to the Z direction are provisionally illustrated as the X direction and the Y direction.

In the case of expressing a direction while distinguishing between positive and negative orientations, the direction is described with the added positive or negative sign, such as "+Z direction" or "−Z direction". In the case of expressing a direction without distinguishing between positive and negative orientations, the direction is described simply as the "Z direction".

As illustrated in FIGS. 1 to 2B, the light source unit 10 includes a plurality of light-emitting elements 11, a plurality of substrates 12 on which the light-emitting elements 11 are mounted, a heatsink 14, a plurality of first fixing screws 15, and a plurality of second fixing screws 16.

The light source unit 10 according to the present embodiment is configured such that a plurality of substrates 12 are fixed to one heatsink 14 with the first fixing screws 15, respectively, but may be configured such that only one substrate 12 is mounted on one heatsink 14.

As illustrated in FIGS. 1 to 2B, the light source unit 10 may be configured such that one substrate 12 is fixed to each of the plurality of divided heatsinks 14 with the first fixing screw 15 and the second fixing screw 16. The light source unit 10 may not include the second fixing screw 16, and may be fixed with only the first fixing screw 15.

As illustrated in FIG. 1, the chamber 20 of the present embodiment includes a light-transmissive window 21 for taking in heating light L1 emitted from the light source unit 10, and a support member 22 that supports the substrate to be treated W1 in the chamber. That is, a main surface W1a of the substrate to be treated W1, supported by the support member 22, is irradiated with the heating light L1 emitted from the light source unit 10 and taken in through the light-transmissive window 21, whereby heating treatment is performed.

The light-emitting element 11 in the present embodiment is an LED with a wavelength showing an intensity peak in the emission spectrum at 395 nm. Note that the light-emitting element 11 is not limited to the LED having that characteristic, and a wavelength showing an intensity peak and a type of the element are arbitrarily selected according to the object to be heated. Specifically, the light-emitting element 11 may be an LED element with a wavelength showing an intensity peak in an emission spectrum belonging to a visible light region or an infrared light region. Furthermore, in the light source unit 10, a plurality of LDs or other light-emitting elements may be mounted instead of the plurality of LEDs or together with the plurality of LEDs.

In the substrate 12, the first main surface 12a is the mounting surface of the light-emitting element 11, and a second main surface 12b on the opposite side (+Z side) to the first main surface 12a is a surface connected to the heatsink 14 via grease (not illustrated) for enhancing thermal conductivity. Note that the substrate 12 and the heatsink 14 may be connected without grease.

The substrate 12 is a ceramic substrate, and is a substrate having the first main surface 12a where a pair of electrodes and a wiring pattern are formed. However, these are not illustrated for the sake of convenience of the drawings. A plurality of light-emitting elements 11 are mounted on the first main surface 12a of the substrate 12, and each light-emitting element 11 is lighted by power supplied between the electrodes. Note that the arrangement pattern of the light-emitting elements 11 illustrated in FIGS. 3 to 5 is merely an example.

The heatsink 14 is a member that dissipates heat generated in the substrate 12 that is transferred directly or via grease. As illustrated in FIGS. 1 to 2B, the heatsink 14 is provided with a screw hole 14a corresponding to a first through hole 12p of the substrate 12 into which the first fixing screw 15 is screwed.

Note that the fixing screws (15,16) are not limited in size and shape as long as the fixing screws are configured to be fixed by being screwed into predetermined screw holes, and may be, for example, bolts to be screwed into screw holes formed in nuts. The screw hole 14a is not necessarily formed in the heatsink 14, and may be a screw hole included in a nut. That is, the substrate 12 and the heatsink 14 may be fixed by inserting bolts through the through holes (12p, 12q) and screwing the bolts into screw holes of nuts disposed on the +Z side of the heatsink 14.

Figure 4:
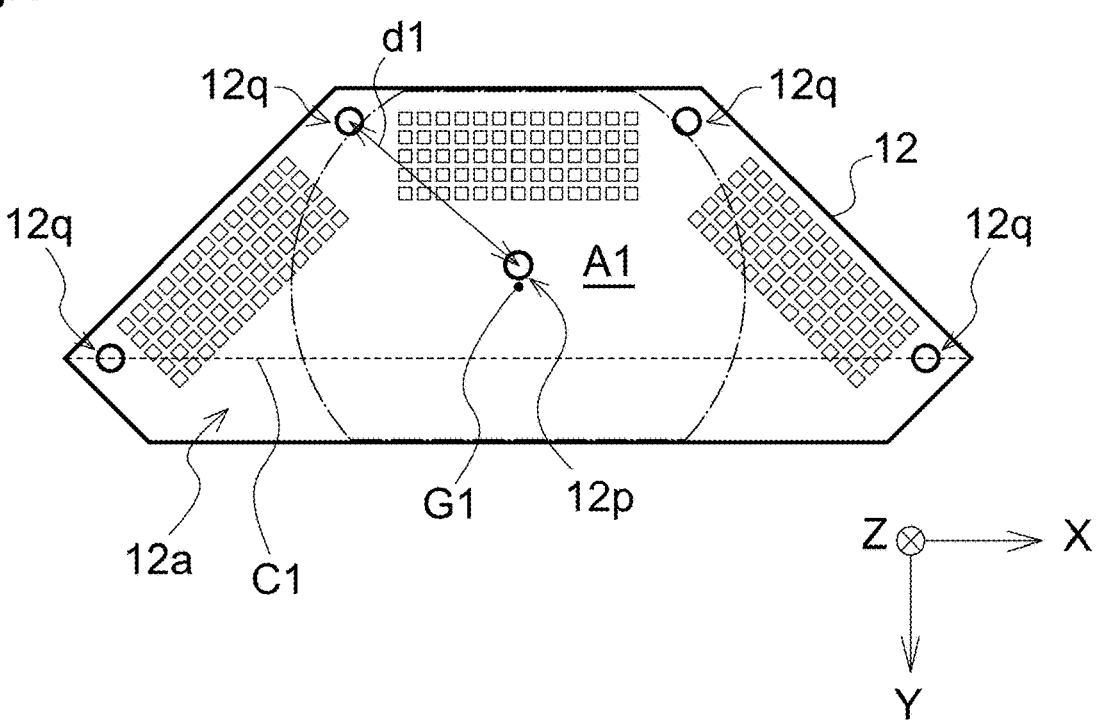
FIG. 4 is a schematic view of one substrate removed from the light source unit when viewed from the −Z side.
Figure 5:
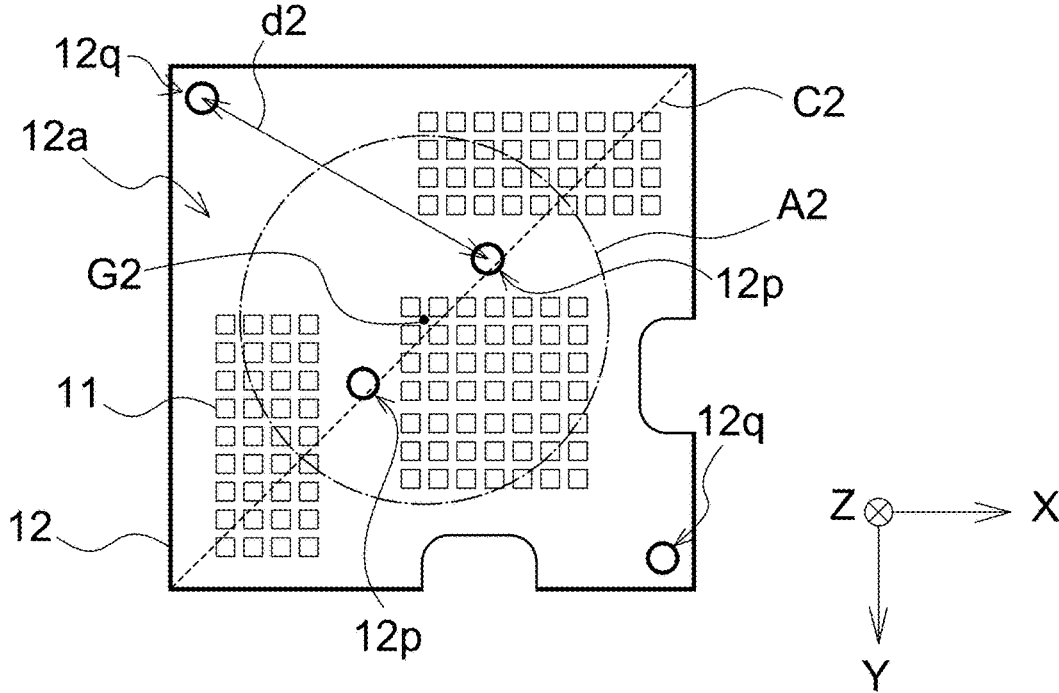
FIG. 5 is a schematic view of one substrate removed from the light source unit when viewed from the −Z side.
Figure 6:
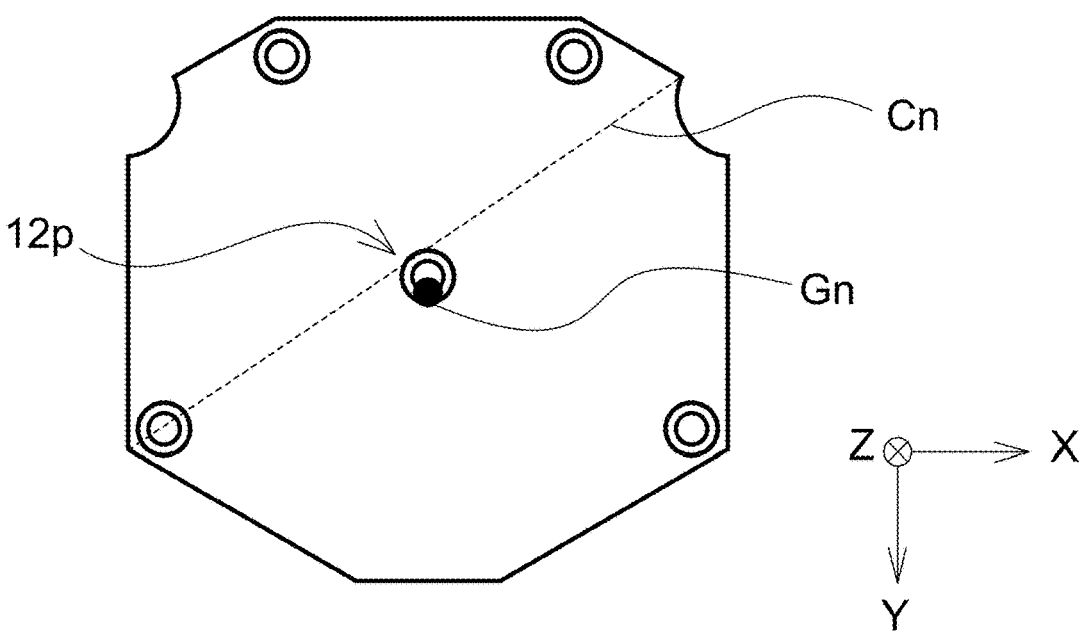
FIG. 6 is a view illustrating a sample used in the verification experiment.
Figure 7:
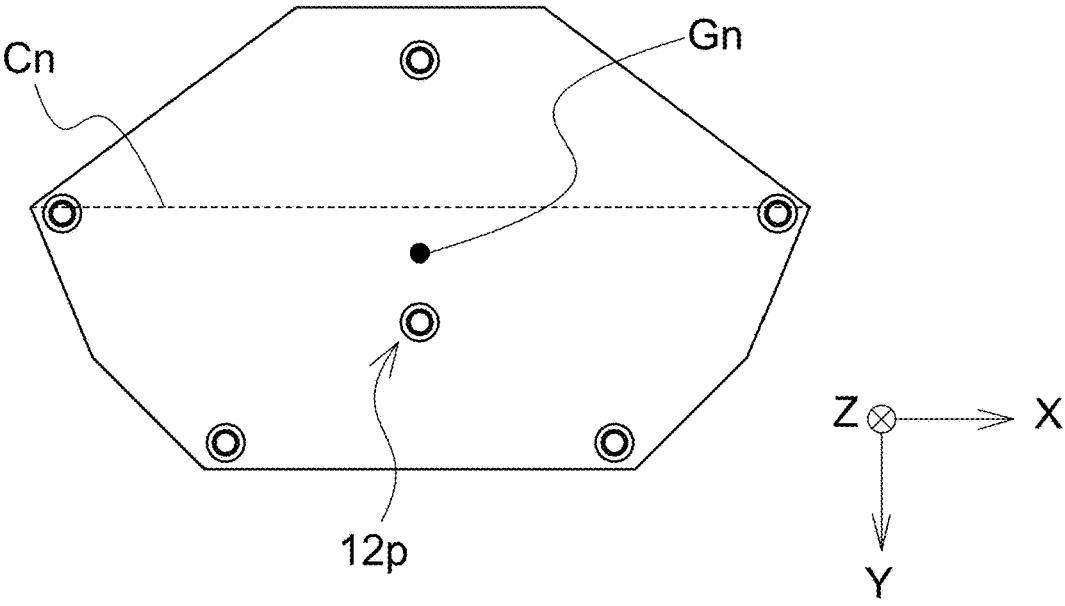
FIG. 7 is a view illustrating a sample used in the verification experiment.
Figure 8:
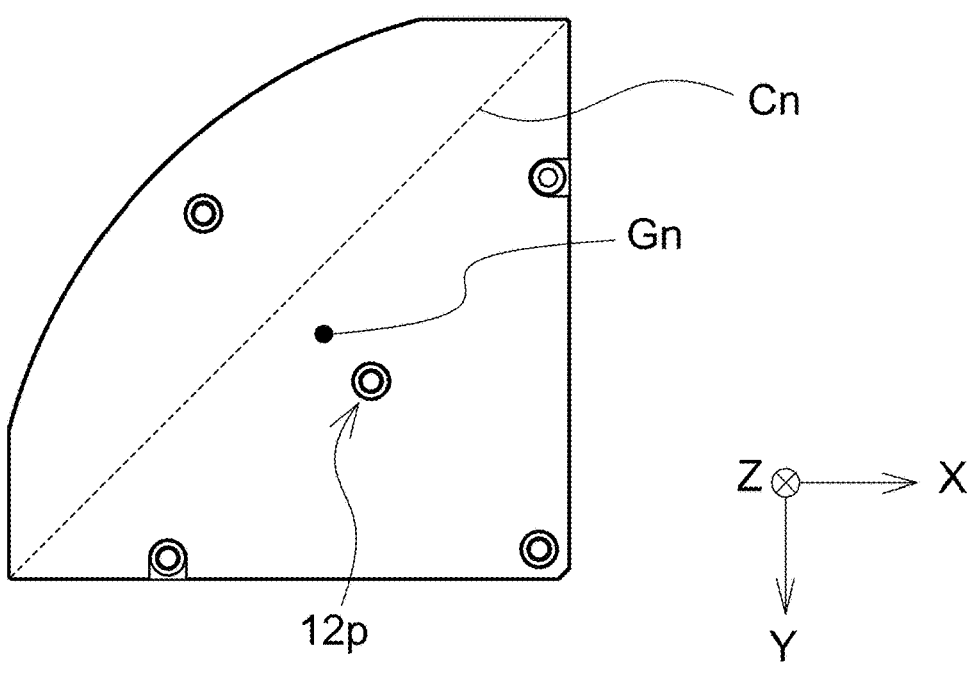
FIG. 8 is a view illustrating a sample used in the verification experiment.
Figure 9:
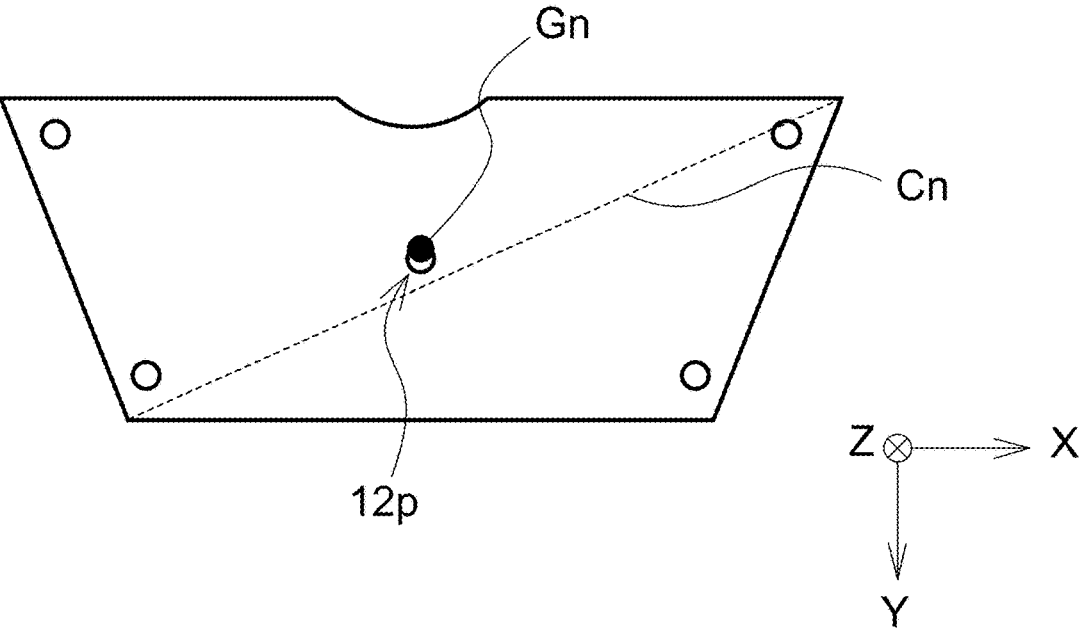
FIG. 9 is a view illustrating a sample used in the verification experiment.
Figure 10:
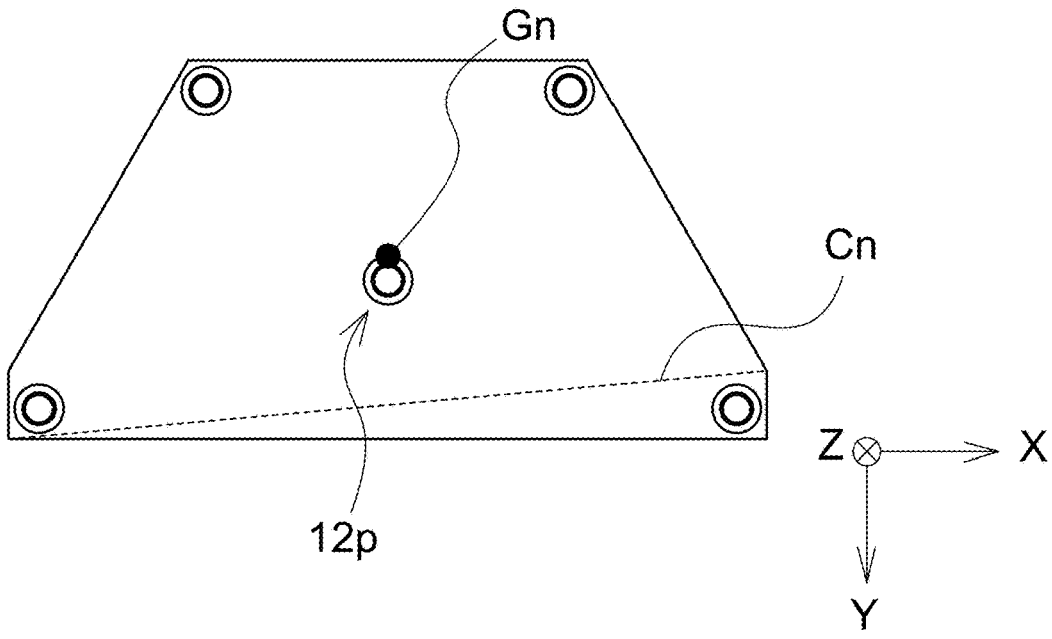
FIG. 10 is a view illustrating a sample used in the verification experiment.
Figure 11:
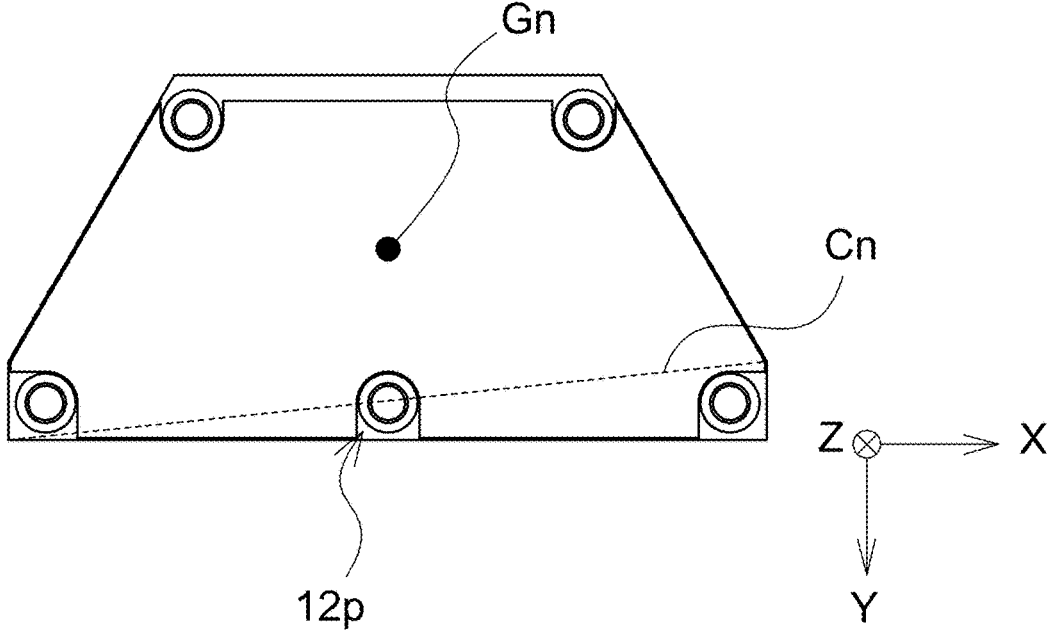
FIG. 11 is a view illustrating a sample used in the verification experiment.
Figure 12:
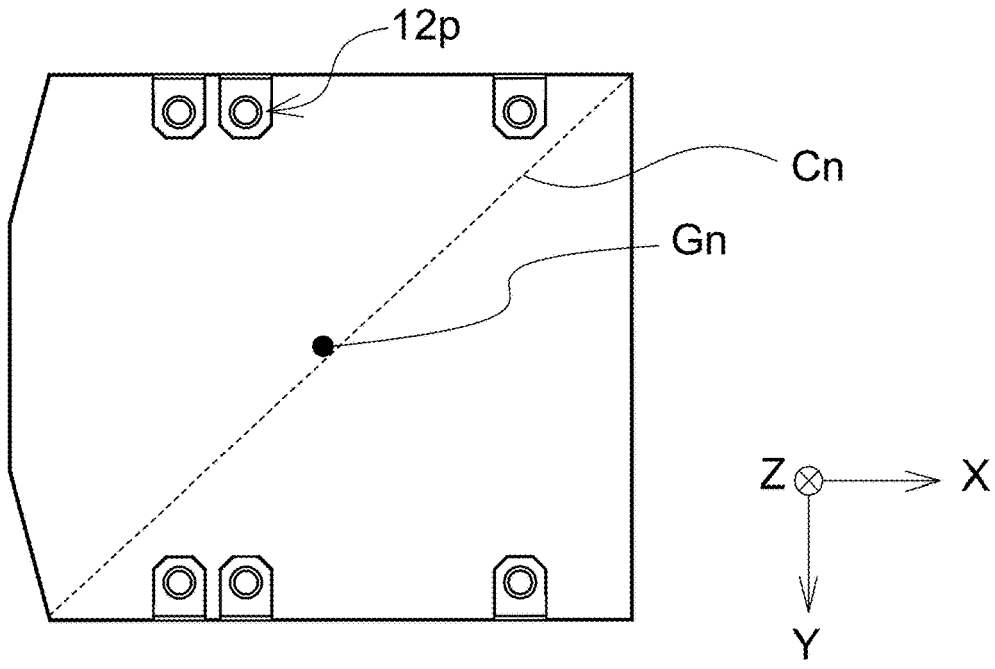
FIG. 12 is a view illustrating a sample used in the verification experiment.
Figure 13:
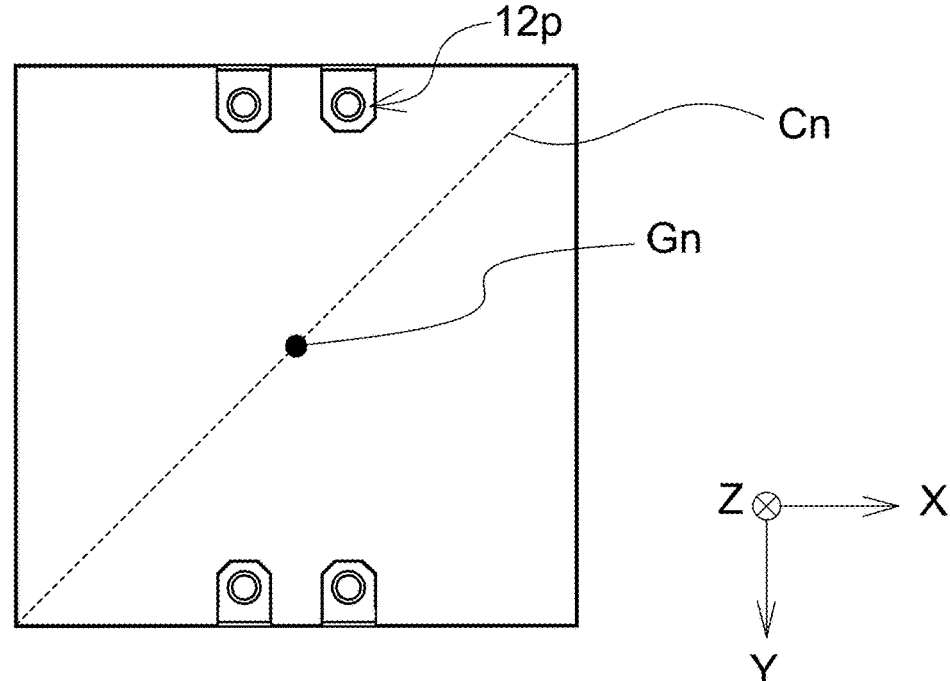
FIG. 13 is a view illustrating a sample used in the verification experiment.
Figure 14:
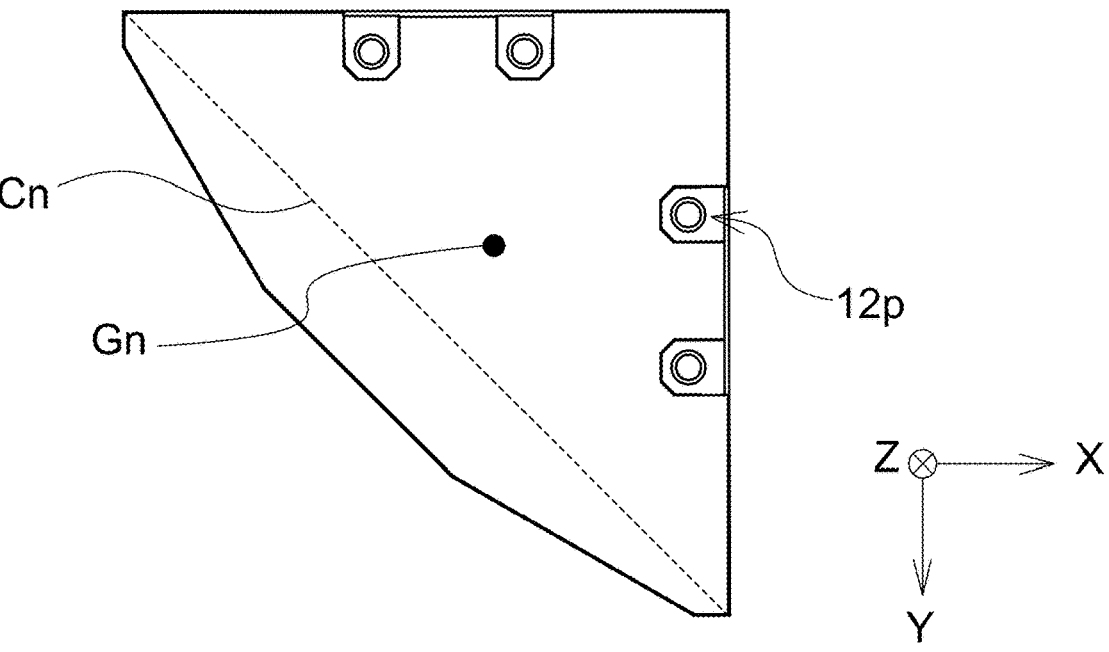
FIG. 14 is a view illustrating a sample used in the verification experiment.
Figure 15:
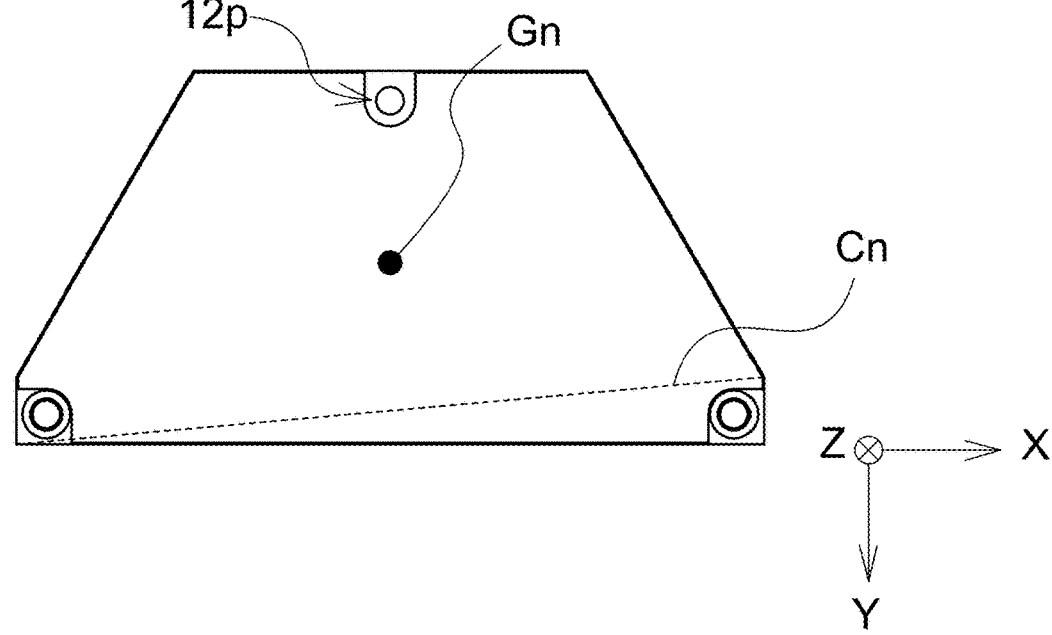
FIG. 15 is a view illustrating a sample used in the verification experiment.
Figure 16:
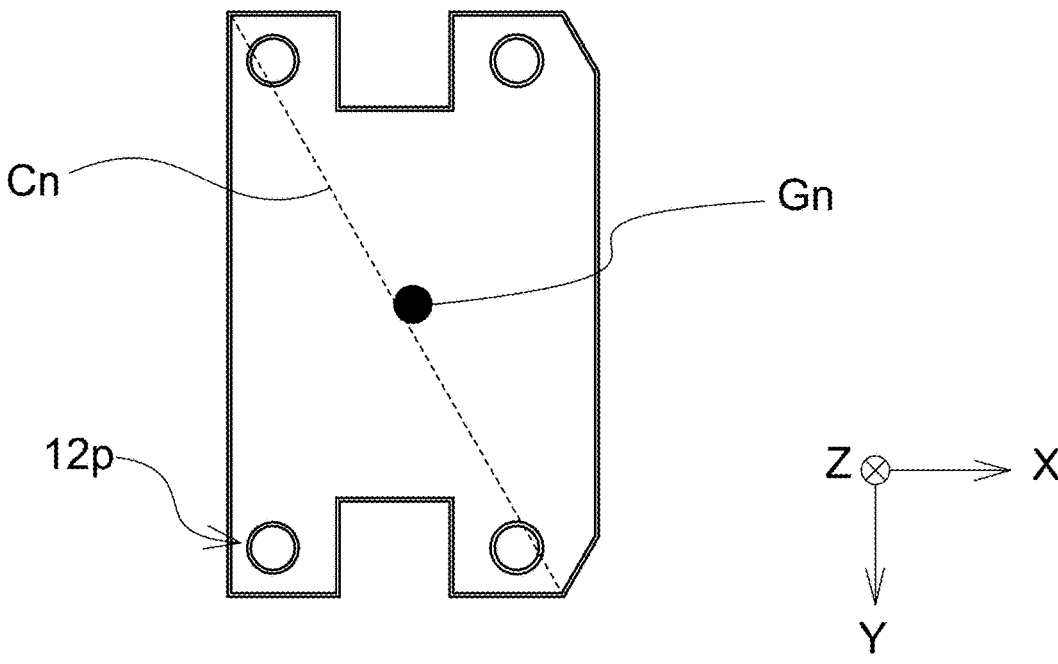
FIG. 16 is a view illustrating a sample used in the verification experiment.

FIGS. 4 and 5 are schematic views when one substrate 12 removed from the light source unit 10 is viewed from the −Z side. As illustrated in FIGS. 4 and 5, the substrate 12 according to the present embodiment has the first through hole 12p formed for inserting the first fixing screw 15, and a plurality of second through holes 12q formed for inserting the second fixing screws 16.

A positional relationship between the first through hole 12p and the second through hole 12q on the first main surface 12a of the substrate 12 will be described with reference to FIGS. 4 and 5.

The first through hole 12p is formed with its center located within a predetermined range (A1, A2) from the center of gravity (G1, G2) on the first main surface 12a when the substrate 12 is viewed in the Z direction. The predetermined ranges A1, A2 are ranges within 25% of the maximum diagonal distance (C1, C2) of the first main surface 12a from the center of gravity (G1, G2), and are areas surrounded by a one-dot chain lines in FIGS. 4 and 5.

Here, the center of gravity on the first main surface 12a is a point corresponding to the geometric center of the first main surface 12a as described above. The center of gravity of the first main surface 12a can be specified by a function of deriving the center of gravity, for example, as installed in computer-aided design (CAD) software.

In the present embodiment, for the substrates 12 having the configurations illustrated in FIGS. 4 and 5, the maximum diagonal distance C1 is 113.4 mm, and the maximum diagonal distance C2 is 80.61 mm, respectively.

The second through hole 12q is formed at a position where a center-to-center separation distance d1 from the first through hole 12p is 55% or less of the maximum diagonal distance C1 when the substrate 12 is viewed in the Z direction. In the present embodiment, for the substrates 12 having the configurations illustrated in FIGS. 4 and 5, the separation distance d1 is 27.68 mm, and a separation distance d2 is 35.598 mm, respectively.

During the lighting of the light-emitting element 11, the first main surface 12a of the substrate 12 is expanded due to heat generated in the light-emitting element 11, and a stress f1, as indicated by a one-dot chain line arrow in FIG. 2A, is applied. In contrast, the second main surface 12b of the substrate 12 does not expand as much as the first main surface 12a because heat is sequentially dissipated by the heatsink 14. Therefore, a stress f2, as indicated by a two-dot chain line arrow in FIG. 2A, is applied relative to the stress f1 applied to the first main surface 12a side.

Due to these stresses (f1, f2), the substrate 12 is deformed with the vicinity of the center of gravity (the vicinity of the first fixing screw 15) moving away from the heatsink 14, that is, becoming convex toward the −Z side. In addition to the phenomenon described above, the substrate 12 can also be deformed according to material characteristics, aging, and other factors. Furthermore, a case where the substrate 12 is slightly warped during manufacturing is also assumed.

Such deformation of the substrate 12 causes the second main surface 12b of the substrate 12 and the heatsink 14 to be separated from each other near the center of gravity (central portion) of the substrate 12, leading to partial deterioration in heat dissipation characteristics. In this case, the entire substrate 12 is not cooled homogeneously.

However, in the light source unit 10 with the above configuration, the vicinity of the center of the second main surface 12b of the substrate 12 is fixed with the first fixing screw 15 so that the second main surface 12b and the heatsink 14 are almost reliably in contact with each other. Therefore, the light source unit 10 with the above configuration maintains the heat dissipation characteristics of the entire substrate 12.

Here, to evaluate the degree of contact between the substrate 12 and the heatsink 14, a simple verification experiment was conducted by fixing a transparent acrylic plate, made to resemble the substrate 12, to a fixing plate, made to resemble the heatsink 14, via grease, and observing the degree of close contact near the centers of the acrylic plate and the fixing plate (near the center of gravity on the main surface of the acrylic plate). The following is a brief description of the experiment.

FIGS. 6 to 16 are diagrams illustrating samples used in the verification experiment. The samples used in the present experiment are a total of 13 samples, including the sample created by imitating the shapes illustrated in FIGS. 4 and 5 and the samples illustrated in FIGS. 6 to 16. The samples illustrated in FIGS. 4 to 11 were, in order, Examples 1 to 8. The samples illustrated in FIGS. 12 to 16 were, in order, Comparative Examples 1 to 5.

The center of gravity (G1, G2, Gn) and the maximum diagonal distance (C1, C2, Cn) of each sample were as illustrated in the drawings, and a length A of the maximum diagonal distance (C1, C2, Cn), a separation distance B between the center of gravity (G1, G2, Gn) and the first through hole 12p, and the ratio of the separation distance B to the length A were as shown in Table 1 below. In the present experiment, a single through hole closest to the center of gravity (G1, G2, Gn) was adopted as representative of the first through hole 12p.

TABLE 1

| Sample | Length A (mm) | Separation distance B (mm) | B/A × 100 (%) |
|---|---|---|---|
| Example 1 | 113.40 | 2.70 | 2.38 |
| Example 2 | 80.61 | 10.02 | 12.43 |

TABLE 1-continued

| Sample | Length A (mm) | Separation distance B (mm) | B/A × 100 (%) |
|---|---|---|---|
| Example 3 | 72.38 | 1.70 | 2.35 |
| Example 4 | 132.20 | 11.69 | 8.84 |
| Example 5 | 146.37 | 12.40 | 8.47 |
| Example 6 | 93.65 | 1.20 | 1.28 |
| Example 7 | 100.40 | 3.20 | 3.19 |
| Example 8 | 82.44 | 15.62 | 18.95 |
| Comparative Example 1 | 125.72 | 38.79 | 30.85 |
| Comparative Example 2 | 121.62 | 37.85 | 31.12 |
| Comparative Example 3 | 125.87 | 28.87 | 22.94 |
| Comparative Example 4 | 100.40 | 21.74 | 21.65 |
| Comparative Example 5 | 55.35 | 21.27 | 38.43 |

In the configurations of Examples 1 to 8 above, when observed through the acrylic plate, voids were not present in the grease or were negligibly small even if present, with particularly good results obtained for Examples 1 to 7. In the configurations of Comparative Examples 1 to 5, unacceptable voids were confirmed in the grease observed through the acrylic plate.

From the above, it can be said that the distance from the center of gravity to the position of the first through hole 12p is preferably 20% or less of the maximum diagonal distance of the first main surface 12a, and more preferably 15% or less.

Therefore, the light source unit 10 mounted in the optical heating apparatus 1 with the above configuration can maintain the heat dissipation characteristics near the center of gravity (central portion) and cool the entire substrate 12 homogeneously, even when the substrate 12 is deformed as described above.

The configurations of the optical heating apparatus 1 and the light source unit 10 described above are merely examples, and the present invention is not limited to the illustrated configurations.

What is claimed is:

1. An optical heating apparatus comprising:

a chamber that a workpiece is accommodated;

an LED circuit board having a first main surface on which a plurality of light-emitting diodes (LEDs) that irradiate light onto the workpiece accommodated in the chamber are mounted;

a first through hole that communicates between the first main surface and a second main surface of the LED circuit board, the second main surface being on a side opposite to the first main surface, the first through hole having a center located within 20% of a maximum diagonal distance of the first main surface from a center of gravity of the first main surface when viewed in a direction orthogonal to the first main surface of the LED circuit board;

a heatsink provided on a side of the second main surface of the LED circuit board;

a first fixing screw that is inserted through the first through hole of the LED circuit board and screwed into a screw hole, provided corresponding to the first through hole, to fix the LED circuit board and the heatsink; and a plurality of second fixing screws that are inserted through each of a plurality of second through holes of the LED circuit board and screwed into each of the plurality of second through holes, provided corresponding to each of the plurality of second through holes, to fix the LED circuit board and the heatsink, wherein on any concentric circle centered on the first fixing screw, there are two or fewer second fixing screws among the plurality of second fixing screws.

2. The optical heating apparatus according to claim 1, wherein the plurality of second through holes includes a second through hole that communicates between the first main surface and the second main surface and is formed at a position where a separation distance from the first through hole is 55% or less of a maximum diagonal distance of the first main surface of the LED circuit board when viewed in the direction orthogonal to the first main surface, and the two or fewer second fixing screws includes a second fixing screw that is inserted through the second through hole of the LED circuit board and screwed into a screw hole, provided corresponding to the second through hole, to fix the LED circuit board and the heatsink.

\* \* \* \* \*